United States Patent
Guo et al.

(10) Patent No.: US 10,995,238 B2
(45) Date of Patent: May 4, 2021

(54) NEUTRAL TO ALKALINE CHEMICAL MECHANICAL POLISHING COMPOSITIONS AND METHODS FOR TUNGSTEN

(71) Applicant: Rohm and Haas Electronic Materials CMP Holdings, Inc., Newark, DE (US)

(72) Inventors: Yi Guo, Newark, DE (US); Tony Quan Tran, Bear, DE (US)

(73) Assignee: Rohm and Haas Electronic Materials CMP Holdings, Newark, DE (US)

( * ) Notice: Subject to any disclaimer, the term of this patent is extended or adjusted under 35 U.S.C. 154(b) by 491 days.

(21) Appl. No.: 16/026,175

(22) Filed: Jul. 3, 2018

(65) Prior Publication Data
US 2020/0010726 A1   Jan. 9, 2020

(51) Int. Cl.
| | |
|---|---|
| *C09G 1/02* | (2006.01) |
| *B24B 37/04* | (2012.01) |
| *C23F 1/00* | (2006.01) |
| *H01L 21/321* | (2006.01) |
| *C23F 1/44* | (2006.01) |

(52) U.S. Cl.
CPC .............. *C09G 1/02* (2013.01); *B24B 37/044* (2013.01); *C23F 1/00* (2013.01); *H01L 21/3212* (2013.01); *C23F 1/44* (2013.01)

(58) Field of Classification Search
CPC . B24B 37/044; C09G 1/02; C23F 1/00; C23F 1/44; H01L 21/3212

USPC .... 252/79.1, 79.2, 79.3, 79.4; 438/691, 692, 438/693

See application file for complete search history.

(56) References Cited

U.S. PATENT DOCUMENTS

| | | |
|---|---|---|
| 4,176,167 A | 11/1979 | Jernigan et al. |
| 6,068,787 A | 5/2000 | Grumbine et al. |
| 7,132,058 B2 | 11/2006 | Thomas et al. |
| 9,567,491 B2 | 2/2017 | Fu et al. |
| 9,783,702 B1 | 10/2017 | Guo et al. |
| 2010/0087065 A1* | 4/2010 | Boggs ...................... C09G 1/02 438/692 |
| 2017/0051181 A1* | 2/2017 | Grumbine ............ C09K 3/1436 |
| 2017/0121561 A1* | 5/2017 | Dockery ................. B24B 37/24 |
| 2017/0275498 A1* | 9/2017 | Tamada ............... C09K 3/1463 |

* cited by examiner

*Primary Examiner* — Lan Vinh
(74) *Attorney, Agent, or Firm* — John J. Piskorski

(57) ABSTRACT

A neutral to alkaline chemical mechanical composition for polishing tungsten includes, as initial components: water; an oxidizing agent selected from an iodate compound, a periodate compound and mixtures thereof; colloidal silica abrasive particles including a nitrogen-containing compound; optionally, a pH adjusting agent; and, optionally, a biocide. The chemical mechanical polishing method includes providing a chemical mechanical polishing pad, having a polishing surface; creating dynamic contact at an interface between the polishing pad and the substrate; and dispensing the neutral to alkaline chemical mechanical polishing composition onto the polishing surface at or near the interface between the polishing pad and the substrate; wherein some of the tungsten is polished away from the substrate and, further, to at least inhibit static etch of the tungsten.

3 Claims, No Drawings

NEUTRAL TO ALKALINE CHEMICAL MECHANICAL POLISHING COMPOSITIONS AND METHODS FOR TUNGSTEN

FIELD OF THE INVENTION

The present invention is directed to the field of chemical mechanical polishing of tungsten to remove some of the tungsten from a substrate and to at least inhibit static etch of the tungsten at pH ranges from neutral to alkaline. More specifically, the present invention is directed to a chemical mechanical polishing composition and method for chemical mechanical polishing of tungsten to remove some of the tungsten from a substrate and to at least inhibit static etch of the tungsten by providing a substrate containing tungsten and a chemical mechanical polishing composition containing, as initial components: water; an oxidizing agent selected from the group consisting of an iodate compound, a periodate compound and mixtures thereof; colloidal silica abrasive particles comprising nitrogen-containing compounds; optionally, a pH adjusting agent; and optionally, a biocide, wherein a pH of the chemical mechanical polishing composition is equal to or greater than 7; providing a chemical mechanical polishing pad, having a polishing surface; creating dynamic contact at an interface between the polishing pad and the substrate; and dispensing the polishing composition onto the polishing surface at or near the interface between the polishing pad and the substrate, wherein some of the tungsten is polished away from the substrate and to at least inhibit static etch of the tungsten.

BACKGROUND OF THE INVENTION

In the fabrication of integrated circuits and other electronic devices, multiple layers of conducting, semiconducting and dielectric materials are deposited on or removed from a surface of a semiconductor wafer. Thin layers of conducting, semiconducting, and dielectric materials can be deposited by a number of deposition techniques. Common deposition techniques in modern processing include physical vapor deposition (PVD), also known as sputtering, chemical vapor deposition (CVD), plasma-enhanced chemical vapor deposition (PECVD), and electrochemical plating (ECP).

As layers of materials are sequentially deposited and removed, the uppermost surface of the wafer becomes non-planar. Because subsequent semiconductor processing (e.g., metallization) requires the wafer to have a flat surface, the wafer needs to be planarized. Planarization is useful in removing undesired surface topography and surface defects, such as rough surfaces, agglomerated materials, crystal lattice damage, scratches, and contaminated layers or materials.

Chemical mechanical planarization, or chemical mechanical polishing (CMP), is a common technique used to planarize substrates, such as semiconductor wafers. In conventional CMP, a wafer is mounted on a carrier assembly and positioned in contact with a polishing pad in a CMP apparatus. The carrier assembly provides a controllable pressure to the wafer, pressing it against the polishing pad. The pad is moved (e.g., rotated) relative to the wafer by an external driving force. Simultaneously therewith, a polishing composition ("slurry") or other polishing solution is provided between the wafer and the polishing pad. Thus, the wafer surface is polished and made planar by the chemical and mechanical action of the pad surface and slurry. However, there is a great deal of complexity involved in CMP. Each type of material requires a unique polishing composition, a properly designed polishing pad, optimized process settings for both polish and post-CMP clean and other factors that must be individually tailored to the application of polishing a particular material.

Chemical mechanical polishing has become a preferred method for polishing tungsten during the formation of tungsten interconnects and contact plugs in integrated circuit designs. Tungsten is frequently used in integrated circuit designs for contact/via plugs. Typically, a contact or via hole is formed through a dielectric layer on a substrate to expose regions of an underlying component, for example, a first level metallization or interconnect. Tungsten is a hard metal and tungsten CMP runs at relatively aggressive settings, such as acid pH ranges of <7, more typically, <4, which poses unique challenges for tungsten CMP. Unfortunately, tungsten removal rates using neutral to alkaline chemical mechanical polishing compositions have been low and substantially unsatisfactory. Part of such unsatisfactory tungsten removal rates at neutral to alkaline pH ranges is the undesired formation of a rigid peroxy-tungsten film. Many acidic CMP compositions include multi-oxidation state metal catalysts, such as iron catalysts, and hydrogen peroxide oxidizers to achieve acceptable tungsten removal rates. When the pH is neutral to alkaline, peroxide chemistry becomes unstable and the peroxy-tungsten film is formed inhibiting tungsten removal rates.

To date, substantially only acid chemical mechanical polishing compositions have provided acceptable tungsten removal rates. Also, many CMP slurries used to polish tungsten, because of their aggressive acidic nature, cause static etching of the tungsten. The static etching of tungsten is a common side-effect of acidic CMP compositions. During the CMP process the metal polishing slurry that remains on the surface of the substrate continues to etch or corrode the tungsten beyond the effects of the CMP. Sometimes such static etching is desired; however, in most semiconductor processes static etch is to be reduced or, preferably, inhibited altogether.

Therefore, there is a need for a neutral to alkaline CMP composition and neutral to alkaline CMP method for tungsten which provides high tungsten removal rates and, further, at least inhibits static etch of tungsten.

SUMMARY OF THE INVENTION

The present invention is directed to a chemical mechanical polishing composition comprising, as initial components: water; an oxidizing agent selected from the group consisting of an iodate compound, a periodate compound and mixtures thereof;

colloidal silica abrasive particles comprising a nitrogen-containing compound;

optionally, a pH adjusting agent; and, optionally, a biocide; and wherein a pH of the chemical mechanical polishing composition is equal to or greater than 7.

The present invention is also directed to a chemical mechanical polishing composition comprising, as initial components: water; an oxidizing agent selected from the group consisting of alkali metal iodates, calcium diiodate, magnesium diiodate, ammonium iodate, alkali metal periodates, calcium diperiodate, magnesium diperiodate, ammonium periodate and mixtures thereof;

colloidal silica abrasive particles comprising a nitrogen-containing compound;

optionally, a pH adjusting agent; and, optionally, a biocide; and wherein a pH of the chemical mechanical polishing composition is 7-13.

The present invention is further directed to a chemical mechanical polishing composition comprising, as initial components: water; an oxidizing agent selected from the group consisting of sodium iodate, potassium iodate, sodium periodate, potassium periodate and mixtures thereof;

colloidal silica abrasive particles comprising a nitrogen-containing compound, wherein the nitrogen-containing compound is on a surface of the colloidal silica abrasive particles, within the colloidal silica abrasive particles, or combinations thereof;

optionally, a dicarboxylic acid;

a pH adjusting agent selected from the group consisting of inorganic acids, inorganic bases and mixtures thereof; and, optionally, a biocide; and wherein a pH of the chemical mechanical polishing composition is 8-12.

The present invention is directed to a method of chemical mechanical polishing tungsten, comprising:

providing a substrate comprising tungsten and a dielectric;

providing a chemical mechanical polishing composition, comprising, as initial components:

water;

an oxidizing agent selected from the group consisting of an iodate compound, a periodate compound and mixtures thereof;

colloidal silica abrasive particles comprising a nitrogen-containing compound;

optionally, a pH adjusting agent; and optionally, a biocide; and wherein a pH of the chemical mechanical polishing composition is equal to or greater than 7;

providing a chemical mechanical polishing pad, having a polishing surface;

creating dynamic contact at an interface between the chemical mechanical polishing pad and the substrate; and dispensing the chemical mechanical polishing composition onto the polishing surface of the chemical mechanical polishing pad at or near the interface between the chemical mechanical polishing pad and the substrate to remove at least some of the tungsten.

The present invention is also directed to a method of chemical mechanical polishing tungsten, comprising:

providing a substrate comprising tungsten and a dielectric;

providing a chemical mechanical polishing composition comprising, as initial components: water; an oxidizing agent selected from the group consisting of alkali metal iodates, calcium diiodate, magnesium diiodate, ammonium iodate, alkali metal periodates, calcium diperiodate, magnesium diperiodate, ammonium periodate and mixtures thereof;

colloidal silica abrasive particles comprising a nitrogen-containing compound;

optionally, a dicarboxylic acid;

a pH adjusting agent selected from the group consisting of inorganic acids, inorganic bases and mixtures thereof; and, optionally, a biocide; and wherein a pH of the chemical mechanical polishing composition is 7-13;

providing a chemical mechanical polishing pad, having a polishing surface;

creating dynamic contact at an interface between the chemical mechanical polishing pad and the substrate; and dispensing the chemical mechanical polishing composition onto the polishing surface of the chemical mechanical polishing pad at or near the interface between the chemical mechanical polishing pad and the substrate to remove at least some of the tungsten.

The present invention is also directed to a method of chemical mechanical polishing tungsten, comprising:

providing a substrate comprising tungsten and a dielectric;

providing a chemical mechanical polishing composition, comprising, as initial components:

water;

an oxidizing agent selected from the group consisting of sodium iodate, potassium iodate, sodium periodate, potassium periodate and mixtures thereof;

colloidal silica abrasive particles comprising a nitrogen-containing compound, wherein the nitrogen-containing compound is at a surface of the colloidal silica abrasive particles, within the colloidal silica abrasive particles or combinations thereof;

optionally, a dicarboxylic acid;

a pH adjusting agent, wherein the pH adjusting agent is an inorganic base selected from the group consisting of aqueous ammonia, potassium hydroxide and mixtures thereof; and optionally, a biocide; and wherein a pH of the chemical mechanical polishing composition is 8-12;

providing a chemical mechanical polishing pad, having a polishing surface;

creating dynamic contact at an interface between the chemical mechanical polishing pad and the substrate; and dispensing the chemical mechanical polishing composition onto the polishing surface of the chemical mechanical polishing pad at or near the interface between the chemical mechanical polishing pad and the substrate to remove at least some of the tungsten.

The present invention is further directed to a method of chemical mechanical polishing tungsten, comprising:

providing a substrate comprising tungsten and a dielectric;

providing a chemical mechanical polishing composition comprising, as initial components: water; an oxidizing agent selected from the group consisting of potassium iodate, potassium periodate and mixtures thereof;

colloidal silica abrasive particles having a net negative zeta potential and comprising a nitrogen-containing compound, wherein the nitrogen-containing compound is at a surface of the colloidal silica abrasive particles, within the colloidal silica abrasive particles or combinations thereof;

optionally, a dicarboxylic acid;

a pH adjusting agent selected from the group consisting of aqueous ammonia, potassium hydroxide and mixtures thereof; and, optionally, a biocide; and wherein a pH of the chemical mechanical polishing composition is 8-10;

providing a chemical mechanical polishing pad, having a polishing surface;

creating dynamic contact at an interface between the chemical mechanical polishing pad and the substrate; and dispensing the chemical mechanical polishing composition onto the polishing surface of the chemical mechanical polishing pad at or near the interface between the chemical mechanical polishing pad and the substrate to remove at least some of the tungsten; wherein the chemical mechanical polishing composition provided has a tungsten removal rate of ≥500 Å/min with a platen speed of 93-113 revolutions per minute, a carrier speed of 87-111 revolutions per minute, a chemical mechanical polishing composition flow rate of 125-300 mL/min, a nominal down force of 21.4 kPa on a 200 mm polishing machine; and, wherein the chemical mechanical polishing pad comprises a polyurethane polishing layer containing polymeric hollow core microparticles and a polyurethane impregnated non-woven subpad.

The foregoing alkaline chemical mechanical polishing compositions and methods of the present invention have tungsten removal rates of equal to or greater than 500 Å/min. at pH values of greater than 7, and, further, at least inhibit unwanted tungsten static etch.

DETAILED DESCRIPTION OF THE INVENTION

As used throughout this specification the following abbreviations have the following meanings, unless the context indicates otherwise: °C.=degrees Centigrade; g=grams; L=liters; mL=milliliters; μ=μm=microns; kPa=kilopascal; Å=angstroms; mV=millivolts; DI=deionized; ppm=parts per million=mg/L; mm=millimeters; cm=centimeter; min=minute; rpm=revolutions per minute; lbs=pounds; kg=kilograms; W=tungsten; 2.54 cm=1 inch; DLS=dynamic light scattering; wt %=percent by weight; RR=removal rate; PS=polishing slurry of the invention; CS=comparative slurry; $KIO_3$=potassium iodate; $KIO_4$=potassium periodate; $H_2O_2$=hydrogen peroxide; $KClO_3$=potassium chlorate; $K_2S_2O_8$=potassium persulfate; $(NH_4)_2S_2O_8$=ammonia persulfate; DEAMS=(N,N-diethylaminomethyl) triethoxysilane, 98% (Gelest Inc., Morrisville, Pa.); TMOS=tetramethyl orthosilicate; TMAH=tetramethyl ammonium hydroxide; TEA=tetraethyl ammonium; and EDA=ethylenediamine.

The term "chemical mechanical polishing" or "CMP" refers to a process where a substrate is polished by means of chemical and mechanical forces alone and is distinguished from electrochemical-mechanical polishing (ECMP) where an electric bias is applied to the substrate. The term "TEOS" means the silicon dioxide formed from the decomposition of tetraethyl orthosilicate $(Si(OC_2H_5)_4)$. The term "planar" means a substantially flat surface or flat topography having two dimensions of length and width. The terms "composition" and "slurry" are used interchangeably throughout the specification. The term "synergistic" means an interaction or cooperation among two or more substances, materials, compounds or parameters to produce a combined effect greater than the sum of their separate effects. The term "alkyl", unless otherwise described in the specification as having substituent groups, means an organic chemical group composed only of carbon and hydrogen (hydrocarbyl) and having a general formula: $C_nH_{2n+1}$. The terms "a" and "an" refer to both the singular and the plural. FUSO™ particles (available from Fuso Chemical Co., Ltd., Osaka, Japan), such as FUSO BS-3™ particles, are prepared by Stober process, wherein all such particles include nitrogen-containing compounds within the particles. KLEBOSOL™ particles (manufactured by AZ Electronic Materials, available from The Dow Chemical Company), such as KLEBOSOL™ 1598-B25 particles, are prepared by water glass process, therefore, no nitrogen-containing compounds are incorporated within the particles. All percentages are by weight, unless otherwise noted. All numerical ranges are inclusive and combinable in any order, except where it is logical that such numerical ranges are constrained to add up to 100%.

The method of polishing a substrate containing tungsten of the present invention includes a chemical mechanical polishing composition comprising (preferably, consisting of), as initial components, water; an oxidizing agent selected from the group consisting of iodate compounds, periodate compounds, and mixtures thereof; colloidal silica abrasive particles comprising a nitrogen-containing compound; optionally, a pH adjusting agent; and, optionally, a biocide; wherein a pH of the chemical mechanical polishing composition is greater than 7. The chemical mechanical polishing compositions and methods of the present invention are free of multi-oxidation state metal catalysts, such as iron (III) catalysts, and free of peroxy-type oxidizers.

Iodate and periodate compounds of the chemical mechanical polishing compositions and methods of the present invention include, but are not limited to, salts of iodic acid and salts of periodic acid. Salts of iodic acid include, but are not limited to, alkali metal iodates selected from the group consisting of sodium iodate, potassium iodate, lithium iodate and mixtures thereof; alkaline earth metal iodates of iodic acid include, but are not limited to, alkaline earth metal iodates selected from the group consisting of calcium diiodate, magnesium diiodate and mixtures thereof; and ammonium salts of iodic acid include ammonium iodate. Salts of periodic acid include, but are not limited to, alkali metal periodates selected from the group consisting of sodium peridoate, potassium periodate, lithium peridoate and mixtures thereof; alkaline earth metal periodates of periodic acid include, but are not limited to, calcium diiperiodate, magnesium diiperiodate and mixtures thereof; and ammonium salts of periodic acid include ammonium periodate. Preferably, in the chemical mechanical polishing compositions and methods of the present invention, the iodate compounds are salts of iodic acid selected from alkali metal iodates, and the periodate compounds are salts of periodic acid selected from alkali metal periodates; more preferably, the iodate compounds are salts of iodic acid selected from the group consisting of sodium iodate, potassium iodate and mixtures thereof, and the periodate compounds are salts of periodic acid selected from the group consisting of sodium periodate, potassium periodate and mixtures thereof; most preferably, in the chemical mechanical polishing compositions and methods of the present invention, the iodate compound is the potassium salt of iodic acid, potassium iodate ($KIO_3$), and the periodate compound is the potassium salt of periodic acid, potassium periodate ($KIO_4$), and, wherein, the most particularly preferred, is the potassium salt of iodic acid, potassium iodate ($KIO_3$). Such iodate and periodate compounds are commercially available, such as from SIGMA-ALDRICH® (Milwaukee, Wis.), or can be prepared by those of skill in the art according to the chemical literature.

Preferably, in the chemical mechanical polishing compositions and methods of the present invention, the iodate compounds, periodate compounds, or mixtures thereof are included in the chemical mechanical polishing compositions of the present invention in amounts of at least 0.001 wt % or greater, more preferably, the iodate compounds, periodate compounds, or mixtures thereof are included in the chemical mechanical polishing compositions of the present invention in amounts of 0.001 wt % to 1 wt %, even more preferably, the iodate compounds, periodate compounds, or mixtures thereof are included in the chemical mechanical polishing compositions of the present invention in amounts of 0.1 wt % to 1 wt %; and, most preferably, the iodate compounds, periodate compounds, or mixtures thereof are included in the chemical mechanical polishing compositions of the present invention in amounts of 0.3 wt % to 0.5 wt %.

Preferably, in the method of chemical mechanical polishing a substrate comprising tungsten of the present invention, the water contained, as an initial component, in the chemical mechanical polishing composition provided is at least one of deionized and distilled to limit incidental impurities.

Optionally, in the method of polishing a substrate of the present invention, the chemical mechanical polishing compositions provided contain, as an initial component, a secondary oxidizing agent, wherein the secondary oxidizing agent is selected from the group consisting of monopersulfates, persulfate, bromates, perbromate, nitrates, halogens, and a mixture thereof. Preferably, when a secondary oxidizing agent is included in the chemical mechanical polishing compositions of the present invention, the secondary oxidizing agents are monopersulfates, persulfates or mixtures thereof. An example of a persulfate is ammonia persulfate. Most preferably, such secondary oxidizing agents are excluded from the chemical mechanical polishing compositions and methods of the present invention.

When secondary oxidizing agents are included in the methods and chemical mechanical polishing compositions of the present invention, the chemical mechanical polishing compositions provided contain, as an initial component, 0.01 to 5 wt %, more preferably, 0.1 to 5 wt %, most preferably, 0.1 to 0.5 wt % of a secondary oxidizing agent.

In the method of polishing a substrate of the present invention, the chemical mechanical polishing compositions provided, contain, as initial components, colloidal silica abrasive particles, wherein the colloidal silica abrasive particles comprise a nitrogen-containing compound. Such nitrogen-containing compounds can be incorporated within the colloidal silica abrasive particles, or can be incorporated on a surface of the colloidal silica abrasive particles, or the chemical mechanical polishing compositions of the present invention can contain, as initial components, colloidal silica abrasive particles having a combination, wherein the nitrogen-containing compounds are incorporated within the colloidal silica abrasive particles, and, wherein, the nitrogen-containing compounds are incorporated on a surface of the colloidal silica abrasive particles. Preferably, in the methods of polishing a substrate with the chemical mechanical polishing compositions of the present invention, colloidal silica abrasive particles include a combination of nitrogen-containing compounds incorporated within and on surfaces of the colloidal silica abrasive particles. Preferably colloidal silica abrasive particles of the present invention have a net negative zeta potential.

Colloidal silica abrasive particles comprising nitrogen-containing compounds are commercially available, or can be prepared by those of ordinary skill in the art as described in the chemical and colloidal silica abrasive particle literature. Examples of commercially available colloidal silica particles having a net (–) negative zeta potential and comprising nitrogen-containing compounds are KLEBOSOL™ 1598-B25 surface modified colloidal silica particles (manufactured by AZ Electronics Materials, available from The Dow Chemical company, Midland, Mich.); and FUSO™ BS-3 internally modified colloidal silica particles, and FUSO™ BS-3 combined internally and surface modified colloidal silica particles (Fuso Chemical Co., Ltd., Osaka, Japan). Internally modified colloidal silica particles are preferably prepared by the Stober process, well known to those of ordinary skill in the art.

In the method of polishing a substrate of the present invention, the chemical mechanical polishing compositions of the present invention can have colloidal silica abrasive particles comprising nitrogen-containing compounds mixed with colloidal silica abrasive particles without nitrogen-containing compounds. An example of a commercially available mixture is DEAMS surface modified FUSO BS-3™ abrasive slurry (80 ppm DEAMS to 1 wt % silica) and KLEBOSOL™ 1598-B25 slurry with net negative zeta potential (manufactured by AZ Electronics Materials, available from The Dow Chemical company).

In the methods of polishing a substrate of the present invention, the chemical mechanical polishing compositions provided contain colloidal silica abrasive particles comprising a nitrogen-containing compound, and, wherein, the chemical mechanical polishing composition has a pH of 7 or greater, preferably, of 7 to 13; preferably, of 8 to 12; more preferably, of 8 to 10; most preferably, from 8 to 9. More preferably, in the methods of polishing a substrate of the present invention, the chemical mechanical polishing compositions provided contain colloidal silica abrasive particles having a permanent net negative zeta potential and comprise a nitrogen-containing compound, wherein, the chemical mechanical polishing compositions have a pH of 7 or greater, preferably, of 7 to 13; more preferably, of 8 to 12; still more preferably, of 8 to 10; most preferably, from 8 to 9, as indicated by a negative zeta potential from –1 mV to –50 mV, preferably, from –20 mV to –45 mV, most preferably, from –30 mV to –45 mV.

Preferably, in the method of polishing a substrate of the present invention with the chemical mechanical polishing compositions of the present invention, the colloidal silica abrasive particles of the present invention comprise (on a surface of colloidal silica abrasive particles, within colloidal silica abrasive particles, or combinations thereof), nitrogen-containing compounds which include, but are not limited to, ammonium compounds having a general formula:

$$R^1R^2R^3R^4N^+ \quad (I)$$

wherein $R^1$, $R^2$, $R^3$ and $R^4$ are independently chosen from hydrogen, $(C_1-C_6)$alkyl, $(C_7-C_{12})$ arylalkyl and $(C_6-C_{10})$ aryl. Such groups can be substituted with one or more hydroxyl groups. Such colloidal silica abrasives containing ammonium compounds can be prepared from methods known in the art or in the literature.

Examples of such nitrogen-containing ammonium compounds are tetramethylammonium, tetraethylammonium, tetrapropylammonium, tetrabutylammonium, tetrapentylammonium, ethyltrimethylammonium and diethyldimethylammonium.

Nitrogen-containing compounds can also include, but are not limited to, compounds having an amino group such as a primary amine, a secondary amine, a tertiary amine or a quaternary amine. Such nitrogen-containing compounds can also include an amino acid having from one to eight carbon atoms such as lysine, glutamine, glycine, iminodiacetic acid, alanine, valine, leucine, isoleucine, serine and threonine.

In various embodiments a molar ratio of the chemical species to silica in the colloidal silica abrasive particles of the present invention is preferably greater than 0.1% and less than 10%.

Aminosilane compounds are the most preferred nitrogen-containing compounds to incorporate on surfaces or into colloidal silica particles of the chemical mechanical polishing compositions of the present invention. Such aminosilane compounds include, but are not limited to, primary aminosilanes, secondary aminosilanes, tertiary aminosilanes, quaternary aminosilanes and multi-podal (e.g., dipodal) aminosilanes. The aminosilane compound can include substantially any suitable aminosilane. Examples of aminosilanes which can be used to practice the present invention are bis(2-hydroxyethyl)-3-aminopropyl trialkoxysilane, diethylaminomethyltrialkoxysilane, (N,N-diethyl-3-aminopropyl)trialkoxysilane), 3-(N-styrylmethyl-2-aminoethylaminopropyl tiralkoxysilane), aminopropyl trialkoxysilane, (2-N-benzylaminoethyl)-3-aminopropyl trialkoxysilane), trialkoxysilyl propyl-N, N, N-trimethyl ammonium, N-(trialkoxysilylyethyl)benzyl-N,N,N-trimethyl ammonium, (bis (methyldialkoxysiylylpropyl)-N-methyl amine, bis(trialkoxysilylpropyl)urea, bis(3-(triakoxysilyl)propyl)-ethylenediamine, bis(trialkoxysilylpropyl)amine, bis (trialkoxysilylpropyl)amine, 3-aminopropyltrialkoxysilane, N-(2-aminoethyl)-3-aminopropylmethyldialkoxysilane, N-(2-aminoethyl)-3-aminopropyltrialkoxysilane, 3-aminopropylmethyldialkoxysilane, 3-aminopropyltrialkoxysilane, 3-aminopropyltriethoxysilane, (N-trialkoxysilylpropyl) polyethyleneimine, trialkoxysilylpropoyldiethylentriamine, N-phenyl-3-aminopropyltrialkoxysilane, N-(vinylbenzyl)-2-aminoethyl-3-aminopropyltrialkoxysilane, 4-aminobutyl-trialkoxysilane, (N,N-diethylaminomethyl) triethoxysilane, and mixtures thereof. Those of ordinary skill in the art readily appreciate that aminosilane compounds are commonly hydrolyzed (or partially hydrolyzed) in an aqueous medium. Thus, by reciting an aminosilane compound, it is understood that the aminosilane or a hydrolyzed (or partially hydrolyzed) species or condensed species thereof can be incorporated in the colloidal silica abrasive particles.

In various embodiments a molar ratio of the aminosilane species to silica in the colloidal silica abrasive particles is preferably greater than 0.1% and less than 10%.

Colloidal silica abrasive particles which include nitrogen containing compounds incorporated within the colloidal silica abrasive particles are preferably prepared by the Stober process, wherein organic alkoxysilanes, such as TMOS and TEOS are used as precursors for silica synthesis and nitrogen-containing compounds are used as catalysts. The TMOS and TEOS as precursors undergo hydrolysis and condensation in an aqueous alkaline environment. The catalysts used to maintain an alkaline pH are nitrogen-containing species, such as, but are not limited to, ammonia, TMAH, TEA and EDA. As counterions, these nitrogen-containing compounds are inevitably trapped inside the colloidal silica abrasive particles during particle growth, thus resulting in colloidal silica abrasive particles comprising nitrogen-containing compounds internally incorporated within the colloidal silica abrasive particles. Examples of a commercially available colloidal silica abrasive particles which include nitrogen-containing compounds incorporated within the particles are particles available from FUSO™, such as FUSO BS-3™ colloidal silica abrasive particles.

Preferably, in the method of polishing a substrate of the present invention, the chemical mechanical polishing compositions provided contain, as an initial component, colloidal silica abrasive particles including a nitrogen-containing compound incorporated therein, on surfaces of the particles, or combinations thereof, wherein, more preferably, the colloidal silica abrasive particles have a net negative zeta potential and comprise nitrogen-containing compounds incorporated therein, on surfaces of the particles, or combinations thereof have an average particle size ≤100 nm, preferably, 5 to 100 nm; more preferably, 10 to 90 nm; most preferably, 20 to 80 nm as measured by dynamic light scattering techniques (DLS).

Preferably, in the method of polishing a substrate of the present invention, the chemical mechanical polishing compositions provided contain 0.01 to 15 wt %, preferably, 0.05 to 10 wt %, more preferably, 0.1 to 7.5 wt %, still more preferably, 0.2 to 5 wt %, most preferably, from 0.2 to 2 wt % of colloidal silica abrasive particles comprising a nitrogen-containing compound incorporated therein, on surfaces of the particles, or combinations thereof. More preferably, the colloidal silica abrasive particles comprising nitrogen-containing compounds have a permanent net negative zeta potential.

Optionally, in the method of polishing a substrate of the present invention, the chemical mechanical polishing compositions provided contain, as an initial component, a dicarboxylic acid, wherein the dicarboxylic acid includes, but is not limited to malonic acid, oxalic acid, succinic acid, adipic acid, maleic acid, malic acid, glutaric acid, tartaric acid, salts thereof or mixtures thereof. More preferably, in the method of polishing a substrate of the present invention, the chemical mechanical polishing composition provided contains, as an initial component, a dicarboxylic acid, wherein the dicarboxylic acid is selected from the group consisting of malonic acid, oxalic acid, succinic acid, tartaric acid, salts thereof and mixtures thereof. Still more preferably, the chemical mechanical polishing compositions provided contain, as an initial component, a dicarboxylic acid, wherein the dicarboxylic acid is selected from the group consisting of malonic acid, oxalic acid, succinic acid, salts thereof and mixtures thereof. Most preferably, in the method of polishing a substrate of the present invention, the chemical mechanical polishing compositions provided contain, as an initial component, the dicarboxylic acid malonic acid or salts thereof. Most preferably, such dicarboxylic acids are excluded from the chemical mechanical polishing compositions and methods of the present invention.

In the method of polishing a substrate of the present invention, when a dicarboxylic acid is included in the chemical mechanical polishing compositions of the present invention, the chemical mechanical polishing compositions provided contain, as an initial component, 1 to 2,600 ppm, preferably, 100 to 1,400 ppm, preferably, 120 to 1,350 ppm, more preferably, 130 to 1,100 ppm, of a dicarboxylic acid, wherein the dicarboxylic acid includes, but is not limited to, malonic acid, oxalic acid, succinic acid, adipic acid, maleic acid, malic acid, glutaric acid, tartaric acid, salts thereof or mixtures thereof. Optionally, in the method of polishing a substrate of the present invention, the chemical mechanical polishing compositions provided contain, as an initial component, 1 to 2,600 ppm of malonic acid, salt thereof or mixtures thereof. Preferably, in the method of polishing a substrate of the present invention, the chemical mechanical polishing compositions provided contain, as an initial component 100 to 1,400 ppm, more preferably, 120 to 1,350 ppm, most preferably, 130 to 1,350 ppm, of the dicarboxylic acid malonic acid or salts thereof.

In the method of polishing a substrate of the present invention, the chemical mechanical polishing compositions provided have a pH of 7 or greater. Preferably, in the method of polishing a substrate of the present invention, the chemical mechanical polishing compositions provided have a pH of 7 to 13. More preferably, in the method of polishing a substrate of the present invention, the chemical mechanical polishing compositions provided have a pH of 8 to 12. Even more preferably, in the method of polishing a substrate of the present invention, the chemical mechanical polishing compositions provided have a pH of 8 to 10; and, most preferably, a pH of 8 to 9.

Preferably, in the method of polishing a substrate of the present invention, the chemical mechanical polishing compositions provided, optionally, contain a pH adjusting agent. Preferably, the pH adjusting agent is selected from the group consisting of inorganic and organic pH adjusting agents. Preferably, the pH adjusting agent is selected from the group consisting of inorganic acids and inorganic bases. More preferably, the pH adjusting agent is selected from the group consisting of aqueous ammonia and potassium hydroxide. Most preferably, the pH adjusting agent is potassium hydroxide.

Optionally, the polishing compositions can contain biocides, such as KORDEX™ MLX (9.5-9.9% methyl-4-isothiazolin-3-one, 89.1-89.5% water and ≤1.0% related reaction product) or KATHON™ ICP III containing active ingredients of 2-methyl-4-isothiazolin-3-one and 5-chloro-2-methyl-4-isothiazolin-3-one, each manufactured by The Dow Chemical Company, (KATHON™ and KORDEX™ are trademarks of The Dow Chemical Company). Such biocides can be included in the chemical mechanical polishing compositions of the present invention in conventional amounts, as known to those of ordinary skill in the art.

Preferably, the substrate provided is a semiconductor substrate comprising tungsten and a dielectric such as TEOS.

Preferably, in the method of polishing a substrate of the present invention, the chemical mechanical polishing pad provided can be any suitable polishing pad known in the art. One of ordinary skill in the art knows to select an appropriate chemical mechanical polishing pad for use in the method of the present invention. More preferably, in the method of polishing a substrate of the present invention, the chemical mechanical polishing pad provided is selected from woven and non-woven polishing pads. Still more preferably, in the method of polishing a substrate of the present invention, the chemical mechanical polishing pad provided comprises a polyurethane polishing layer. Most preferably, in the method of polishing a substrate of the present invention, the chemical mechanical polishing pad provided comprises a polyurethane polishing layer containing polymeric hollow core microparticles and a polyurethane impregnated non-woven subpad. Preferably, the chemical mechanical polishing pad provided has at least one groove on the polishing surface.

Preferably, in the method of polishing a substrate of the present invention, the chemical mechanical polishing composition provided is dispensed onto a polishing surface of the chemical mechanical polishing pad provided at or near an interface between the chemical mechanical polishing pad and the substrate.

Preferably, in the method of polishing a substrate of the present invention, dynamic contact is created at the interface between the chemical mechanical polishing pad provided and the substrate with a down force of 0.69 to 34.5 kPa normal to a surface of the substrate being polished.

In the method of polishing a substrate comprising tungsten of the present invention, the chemical mechanical polishing composition provided has a tungsten removal rate ≥500 Å/min.; preferably, a tungsten removal rate ≥1,000 Å/min; more preferably, ≥1,100 Å/min; further preferably, ≥1200 Å/min.; even more preferably, ≥2000 Å/min.; and a W/TEOS selectivity of ≥11, preferably, a W/TEOS selectivity of ≥12, more preferably, a W/TEOS selectivity of 18-24; and with a platen speed of 93-113 revolutions per minute, a carrier speed of 87-111 revolutions per minute, a chemical mechanical polishing composition flow rate of 125-300 mL/min, a nominal down force of 21.4 kPa on a 200 mm polishing machine; and, wherein the chemical mechanical polishing pad comprises a polyurethane polishing layer containing polymeric hollow core microparticles and a polyurethane impregnated non-woven subpad.

The following examples are intended to illustrate the high removal rates of tungsten from substrates using alkaline chemical mechanical polishing compositions of the present invention, inhibition of tungsten static etch rate, and W/TEOS selectivity, but the following examples are not intended to limit the scope of the invention.

Example 1

Slurry Formulations

The chemical mechanical polishing compositions of this Example were prepared by combining the components in the amounts listed in Table 1 with the balance being DI water and adjusting the pH of the compositions to the final pH listed in Table 1 with 45 wt % aqueous ammonia.

TABLE 1

| Slurry # | Nitrogen Containing Silica Particles[1] Wt% | $KClO_3$ Wt% | $K_2S_2O_8$ Wt% | $H_2O_2$ wt% | $KIO_3$ wt% | $KIO_4$ wt% | pH |
|---|---|---|---|---|---|---|---|
| CS-1 | 1 | 0.5 | — | — | — | — | 8 |
| CS-2 | 1 | — | 0.5 | — | — | — | 8 |
| CS-3 | 1 | — | — | 0.5 | — | — | 8 |
| PS-1 | 1 | — | — | — | 0.5 | — | 8 |
| PS-2 | 1 | — | — | — | 0.5 | — | 7 |
| PS-3 | 1 | — | — | — | 0.5 | — | 9 |
| PS-4 | 1 | — | — | — | — | 0.5 | 8 |

[1]Mixture of (80 ppm DEAMS to 1 wt% silica) surface modified FUSO BS-3 ™ abrasive slurry and KLEBOSOL ™ 1598-B25 abrasive slurry with net (−) zeta potential manufactured by AZ Electronics Materials, available from The Dow Chemical Company.

Example 2

W Removal Rates

The polishing experiments for the polishing slurries of Table 1 in Example 1 above were performed on 200 mm blanket wafers installed on an Applied Materials 6EC polishing machine. The polishing removal rate experiments were performed on 200 mm blanket 15 kÅ-thick TEOS sheet wafers from Novellus and W, Ti, and TiN blanket wafers available from WaferNet Inc., Silicon Valley Microelectronics or SKW Associates, Inc. All polishing experiments were performed using an IC1010™ polyurethane polishing pad paired with an SP2310 subpad (commercially available from Rohm and Haas Electronic Materials CMP Inc.) with a typical down pressure of 21.4 kPa (3.1 psi), a chemical mechanical polishing composition flow rate of 200 mL/min, a table rotation speed of 113 rpm and a carrier rotation speed of 111 rpm. A Kinik PDA33A-3 diamond pad conditioner (commercially available from Kinik Company) was used to dress the polishing pad. The polishing pad was broken in with the conditioner using a down force of 9 lbs (4.1 kg) for 15 minutes and 7 lbs (3.2 kg) for 15 minutes at 80 rpm (platen)/36 rpm (conditioner). The polishing pad was further conditioned ex-situ prior to polishing using a down force of 7 lbs (3.2 kg) for 24 seconds. The W removal rates were determined using a KLA-Tencor RS100C metrology tool.

TABLE 2

| Slurry # | W RR | Zeta Potential[2] (mV) |
|---|---|---|
| CS-1 | 54 | −39 |
| CS-2 | 40 | −37 |
| CS-3 | 51 | −34 |
| PS-1 | 2166 | −35 |
| PS-2 | 1697 | −30 |

TABLE 2-continued

| Slurry # | W RR | Zeta Potential[2] (mV) |
|---|---|---|
| PS-3 | 1466 | −44 |
| PS-4 | 1328 | −36 |

[2]Zeta Potential: Zeta potential of the indicated compositions was measured using a Malvern Zetasizer™ instrument (Malvern Instruments, Malvern, UK) as 15-30 wt % concentrates. The reported value was taken from a single measurement for each indicated composition.

The results of the polishing tests showed significant increases in W RR using alkaline chemical mechanical polishing compositions of the invention in contrast to the comparative compositions.

Example 3

W RR and TEOS RR

The chemical mechanical polishing compositions of this Example were prepared by combining the components in the amounts listed in Table 3 with the balance being DI water and adjusting the pH of the compositions to the final pH listed in Table 3 with 45 wt % aqueous potassium hydroxide.

TABLE 3

| Slurry # | Nitrogen-Compound Containing Silica Particles[3] Wt % | $(NH_4)_2S_2O_8$ Wt % | $KIO_3$ Wt % | pH |
|---|---|---|---|---|
| CS-4 | 1 | 0.3 | 0.3 | 9 |
| PS-5 | 1 | — | 0.3 | 9 |

[3]DEAMS surface modified KLEBOSOL™ 1598-B25 abrasive slurry with net (−) zeta potential manufactured by AZ Electronics Materials, available from The Dow Chemical Company.

The polishing experiments for the polishing slurries of Table 3 were performed on 200 mm blanket wafers installed on an Applied Materials Reflexion polishing machine. The polishing removal rate experiments were performed on 200 mm blanket 15 kÅ-thick TEOS sheet wafers from Novellus and W, Ti, and TiN blanket wafers available from WaferNet Inc., Silicon Valley Microelectronics or SKW Associates, Inc. All polishing experiments were performed using an IC1000™ K7+R32 polyurethane polishing pad paired with an SP2310 subpad (commercially available from Rohm and Haas Electronic Materials CMP Inc.) with a typical down pressure of 21.4 kPa (3.1 psi), a chemical mechanical polishing composition flow rate of 300 mL/min., a table rotation speed of 93 rpm and a carrier rotation speed of 87 rpm. The polishing pad was broken in and conditioned as described above in Example 2. The W and TEOS removal rates were determined using a KLA-Tencor RS100C metrology tool.

TABLE 4

| Slurry # | W RR (Å/min) | TEOS RR (Å/min) | W/TEOS Selectivity |
|---|---|---|---|
| CS-4 | 95 | 66 | 1.4 |
| PS-5 | 1198 | 49 | 24.4 |

Adding a secondary oxidizing agent resulted in significant detrimental W polishing results in contrast to the polishing composition of the present invention which included only $KIO_3$ as the oxidizing agent.

Example 4

W RR and TEOS RR

The chemical mechanical polishing compositions of this Example were prepared by combining the components in the amounts listed in Table 5 with the balance being DI water and adjusting the pH of the compositions to the final pH listed in Table 5 with 45 wt % aqueous ammonia.

TABLE 5

| Slurry # | Nitrogen-Compound Containing Silica Particles[4] wt% | Nitrogen-Compound Containing Silica Particles[5] wt% | Nitrogen-Compound Containing Silica Particles[6] wt% | K1598-B25 Silica Particles[7] wt% | $KIO_3$ Wt% | pH |
|---|---|---|---|---|---|---|
| PS-6 | 2 | — | — | — | 0.5 | 9 |
| PS-7 | — | — | 2 | — | 0.5 | 9 |
| PS-8 | 2 | — | — | — | 0.5 | 8 |
| PS-9 | — | 2 | — | — | 0.5 | 8 |
| PS-10 | — | 2 | — | — | 0.5 | 8 |
| CS-5 | — | — | — | 2 | 0.5 | 8 |

[4]DEAMS surface modified FUSO BS-3™ abrasive slurry with net (−) zeta potential.
[5]DEAMS surface modified KLEBOSOL™ 1598-B25 abrasive slurry with net (−) zeta potential.
[6]FUSO BS-3™ abrasive slurry with net (−) zeta potential
[7]KLEBOSOL™ 1598-B25 abrasive slurry with net (−) zeta potential.

The polishing experiments for the polishing slurries of Table 5 were performed on 200 mm blanket wafers installed on an Applied Materials Reflexion polishing machine. The polishing removal rate experiments were performed on 200 mm blanket 15 kÅ-thick TEOS sheet wafers from Novellus and W, Ti, and TiN blanket wafers available from WaferNet Inc., Silicon Valley Microelectronics or SKW Associates, Inc. All polishing experiments were performed using an VP6000™ K7+R32 polyurethane polishing pad paired with an SP2310 subpad (commercially available from Rohm and Haas Electronic Materials CMP Inc.) with a typical down pressure of 21.4 kPa (3.1 psi), a chemical mechanical polishing composition flow rate of 200 mL/min, a table rotation speed of 113 rpm and a carrier rotation speed of 111 rpm. The polishing pad was broken in and conditioned as described above in Example 2. The W and TEOS removal rates were determined using a KLA-Tencor RS100C metrology tool.

TABLE 6

| Slurry # | W RR (Å/min) | TEOS RR (Å/min) | W/TEOS Selectivity |
|---|---|---|---|
| PS-6 | 2308 | 128 | 18 |
| PS-7 | 1667 | 136 | 12.3 |
| PS-8 | 2323 | 159 | 14.6 |
| PS-9 | 576 | 72 | 8 |
| PS-10 | 797 | 100 | 8 |
| CS-5 | 313 | 96 | 3.3 |

Slurries of the present invention containing the combination of potassium iodate and colloidal silica abrasive particles having a net negative zeta potential and comprising a nitrogen-containing compound had significant increases in W RR vs. the comparative slurry which did not have the combination of the potassium iodate and colloidal silica abrasive particles having a net negative zeta potential and comprising a nitrogen-containing compound.

Example 5

W RR and TEOS RR

The chemical mechanical polishing compositions of this Example were prepared by combining the components in the amounts listed in Table 7 with the balance being DI water and adjusting the pH of the compositions to the final pH listed in Table 7 with 45 wt % aqueous potassium hydroxide.

TABLE 7

| Slurry # | Nitrogen Containing Silica Particles[8] wt % | $(NH_4)_2S_2O_8$ Wt % | $KIO_3$ wt % | pH |
|---|---|---|---|---|
| PS-11 | 1 | — | 0.1 | 9 |
| PS-12 | 1 | — | 0.3 | 9 |
| PS-13 | 1 | 0.3 | 0.3 | 9 |
| PS-14 | 1 | 0.3 | 0.3 | 8 |
| PS-15 | 1 | — | 0.5 | 9 |

[8]DEAMS surface modified, and nitrogen-containing compound within FUSO BS-3 ™ abrasive slurry with net (−) zeta potential.

The polishing experiments for the polishing slurries of Table 7 were performed on 200 mm blanket wafers installed on an Applied Materials Mirra polishing machine. The polishing removal rate experiments were performed on 200 mm blanket 15 kÅ-thick TEOS sheet wafers from Novellus and W, Ti, and TiN blanket wafers available from WaferNet Inc., Silicon Valley Microelectronics or SKW Associates, Inc. All polishing experiments were performed using an IK4250H™ K7+R32 polyurethane polishing pad paired with an SP2310 subpad (commercially available from Rohm and Haas Electronic Materials CMP Inc.) with a typical down pressure of 21.4 kPa (3.1 psi), a chemical mechanical polishing composition flow rate of 125 mL/min, a table rotation speed of 113 rpm and a carrier rotation speed of 111 rpm. The polishing pad was broken in and conditioned as described above in Example 2. The W and TEOS removal rates were determined using a KLA-Tencor RS100C metrology tool.

TABLE 8

| Slurry # | W RR (Å/min) | TEOS RR (Å/min) | W/TEOS Selectivity |
|---|---|---|---|
| PS-11 | 576 | 25 | 23 |
| PS-12 | 1097 | 49 | 22.4 |
| PS-13 | 88 | 66 | 1.3 |
| PS-14 | 1285 | 61 | 21 |
| PS-15 | 1199 | 50 | 24 |

With the exception of PS-13, the chemical mechanical polishing compositions of the present invention showed high W RR and high W/TEOS selectivity.

Example 6

W Static Etch Rate

The chemical mechanical polishing compositions of this Example were prepared by combining the components in the amounts listed in Tables 9 and 10 with the balance being DI water and adjusting the pH of the compositions to the final pH listed in Tables 9 and 10 with 45 wt % aqueous potassium hydroxide.

TABLE 9

| Slurry # | Nitrogen Containing Silica Particles[9] Wt % | $KIO_3$ | pH |
|---|---|---|---|
| PS-16 | 2 | 0.1 | 9 |
| PS-17 | 2 | 0.1 | 8 |
| PS-18 | 2 | 0.5 | 7 |

[9]Mixture of (80 ppm DEAMS to 1 wt % silica) surface modified FUSO BS-3 ™ abrasive slurry and KLEBOSOL ™ 1598-B25 abrasive slurry with net (−) zeta potential manufactured by AZ Electronics Materials, available from The Dow Chemical Company.

TABLE 10

| Slurry # | Abrasive[10] wt % | $Fe(NO_3)_3$ ppm | Malonic Acid ppm | $H_2O_2$ wt % | pH |
|---|---|---|---|---|---|
| CS-6 | 2 | 362 | 1320 | 2 | 2.5 |

[10]KLEBOSOL 1598-B25 abrasive slurry with net (−) zeta potential.

The static etch tests were carried out by immersing 20 cm (8 inches) diameter W blanket wafers in 15 g slurry samples at room temperature. The W wafers were removed from tested slurries after 30 min. The W removal was calculated from pst thickness minus pre thickness measured using 4-probe conductivity method. The results of the static etch tests are in Table 11.

TABLE 11

| Slurry # | W Static Etch Rate (Å/min) |
|---|---|
| PS-16 | 1.1 |
| PS-17 | 1.7 |
| PS-18 | 0.9 |
| CS-6 | 31.7 |

The results of the static etch rate showed that the polishing slurries of the present invention had significantly reduced static etch rates in contrast to a conventional acidic polishing slurry which contained an iron catalyst and hydrogen peroxide oxidizing agent.

Example 7

W RR and TEOS RR

The chemical mechanical polishing compositions of this Example were prepared by combining the components in the amounts listed in Table 12 with the balance being DI water and adjusting the pH of the compositions to the final pH listed in Table 12 with 45 wt % aqueous potassium hydroxide.

TABLE 12

| Slurry # | Nitrogen Containing Silica Particles[11] Wt % | $H_2O_2$ wt % | $KIO_3$ wt % | pH |
|---|---|---|---|---|
| PS-19 | 2 | — | 0.5 | 7 |
| CS-7 | 2 | 0.25 | 0.5 | 7 |

[11]DEAMS surface modified FUSO BS-3 ™ abrasive slurry with net (−) zeta potential.

The polishing experiments for the polishing slurries of Table 12 were performed on 200 mm blanket wafers installed on an Applied Materials Reflexion polishing machine. The polishing removal rate experiments were performed on 200 mm blanket 15 kÅ-thick TEOS sheet wafers from Novellus and W, Ti, and TiN blanket wafers available from WaferNet Inc., Silicon Valley Microelectronics or SKW Associates, Inc. All polishing experiments were performed using an IK4250H™ K7+R32 polyurethane polishing pad paired with an SP2310 subpad (commercially available from Rohm and Haas Electronic Materials CMP Inc.) with a typical down pressure of 21.4 kPa (3.1 psi), a chemical mechanical polishing composition flow rate of 250 mL/min, a table rotation speed of 113 rpm and a carrier rotation speed of 111 rpm. The polishing pad was broken in and conditioned as described above in Example 2. The W and TEOS removal rates were determined using a KLA-Tencor RS100C metrology tool.

TABLE 13

| Slurry # | W RR (Å/min) | TEOS RR (Å/min) | W/TEOS Selectivity |
|---|---|---|---|
| PS-19 | 2278 | 200 | 11.4 |
| CS-7 | 359 | 232 | 1.5 |

Adding a secondary oxidizing agent resulted in significant detrimental W polishing results in contrast to the polishing composition of the present invention which included only $KIO_3$ as the oxidizing agent.

What is claimed is:

1. A method of chemical mechanical polishing tungsten, comprising:
    providing a substrate comprising tungsten and a dielectric;
    providing a chemical mechanical polishing composition, comprising, as initial components:
    water;
    an oxidizing agent selected from the group consisting of iodate compounds, periodate compounds and mixtures thereof;
    colloidal silica abrasive particles comprising a nitrogen-containing compound;
    optionally, a pH adjusting agent; and
    optionally, a biocide; and wherein a pH of the chemical mechanical polishing composition is equal to or greater than 7;
    providing a chemical mechanical polishing pad, having a polishing surface;
    creating dynamic contact at an interface between the chemical mechanical polishing pad and the substrate; and
    dispensing the chemical mechanical polishing composition onto the polishing surface of the chemical mechanical polishing pad at or near the interface between the chemical mechanical polishing pad and the substrate to remove at least some of the tungsten, wherein the chemical mechanical polishing composition has a tungsten removal rate of ≥500 Å/min with a platen speed of 93-113 revolutions per minute, a carrier speed of 87-111 revolutions per minute, a chemical mechanical polishing composition flow rate of 125-300 mL/min, a nominal down force of 21.4 kPa on a 200 mm polishing machine; and, wherein the chemical mechanical polishing pad comprises a polyurethane polishing layer containing polymeric hollow core microparticles and a polyurethane impregnated non-woven subpad.

2. The method of chemical mechanical polishing tungsten of claim 1, wherein the iodate compounds are selected from the group consisting of alkali metal iodates, calcium diiodate, magnesium diiodate, ammonium iodate and mixtures thereof.

3. The method of chemical mechanical polishing tungsten of claim 1, wherein the periodate compounds are selected from the group consisting of alkali metal periodates, calcium diperiodate, magnesium diperiodate, ammonium periodate and mixtures thereof.

* * * * *